(12) United States Patent
Kurata

(10) Patent No.: US 6,353,375 B2
(45) Date of Patent: Mar. 5, 2002

(54) MAGNETOSTATIC WAVE DEVICE

(75) Inventor: Hitoyoshi Kurata, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/740,883

(22) Filed: Dec. 21, 2000

Related U.S. Application Data

(63) Continuation of application No. PCT/JP00/02543, filed on Apr. 19, 2000.

(30) Foreign Application Priority Data

| Apr. 22, 1999 | (JP) | 11-115086 |
|---|---|---|
| Apr. 22, 1999 | (JP) | 11-115087 |
| Apr. 22, 1999 | (JP) | 11-115088 |
| Mar. 17, 2000 | (JP) | 12-075852 |

(51) Int. Cl.$^7$ ............. H01P 1/00; H01P 1/215
(52) U.S. Cl. .................. 333/219.2; 333/202
(58) Field of Search ............. 333/202, 219.2; 335/296, 297, 298

(56) References Cited

U.S. PATENT DOCUMENTS

| 5,053,734 A | * | 10/1991 | Murakami et al. | 333/219.2 |
|---|---|---|---|---|
| 5,428,324 A | * | 6/1995 | Andersson et al. | 333/202 |
| 6,091,313 A | | 7/2000 | Kurata | 333/219.2 |
| 6,114,929 A | | 9/2000 | Kurata | 333/202 |

FOREIGN PATENT DOCUMENTS

| JP | A 62-256501 | 11/1987 |
|---|---|---|
| JP | A 01-303901 | 12/1989 |
| JP | 05-175710 | 7/1993 |
| JP | 10-075107 | 3/1998 |
| JP | 11-067540 | 9/1999 |

* cited by examiner

*Primary Examiner*—Justin P. Bettendorf
*Assistant Examiner*—Dean Takaoka
(74) *Attorney, Agent, or Firm*—Oblon, Spivak, McClelland, Maier & Neustadt, P.C.

(57) ABSTRACT

A magnetostatic wave device including a ferrimagnetic film for exciting and propagating magnetostatic waves and a magnetic field generator for applying a magnetic field to the ferrimagnetic film. The magnetic field generator includes a permanent magnet and one pair of yokes that are magnetically connected to the permanent magnet and are opposite to each other with an air gap located between them. The air gap has the ferrimagnetic film received therein.

30 Claims, 9 Drawing Sheets

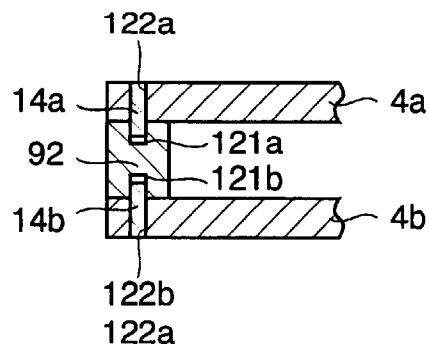
FIG. 4A
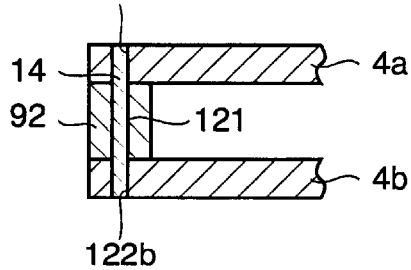
FIG. 4B
FIG. 5
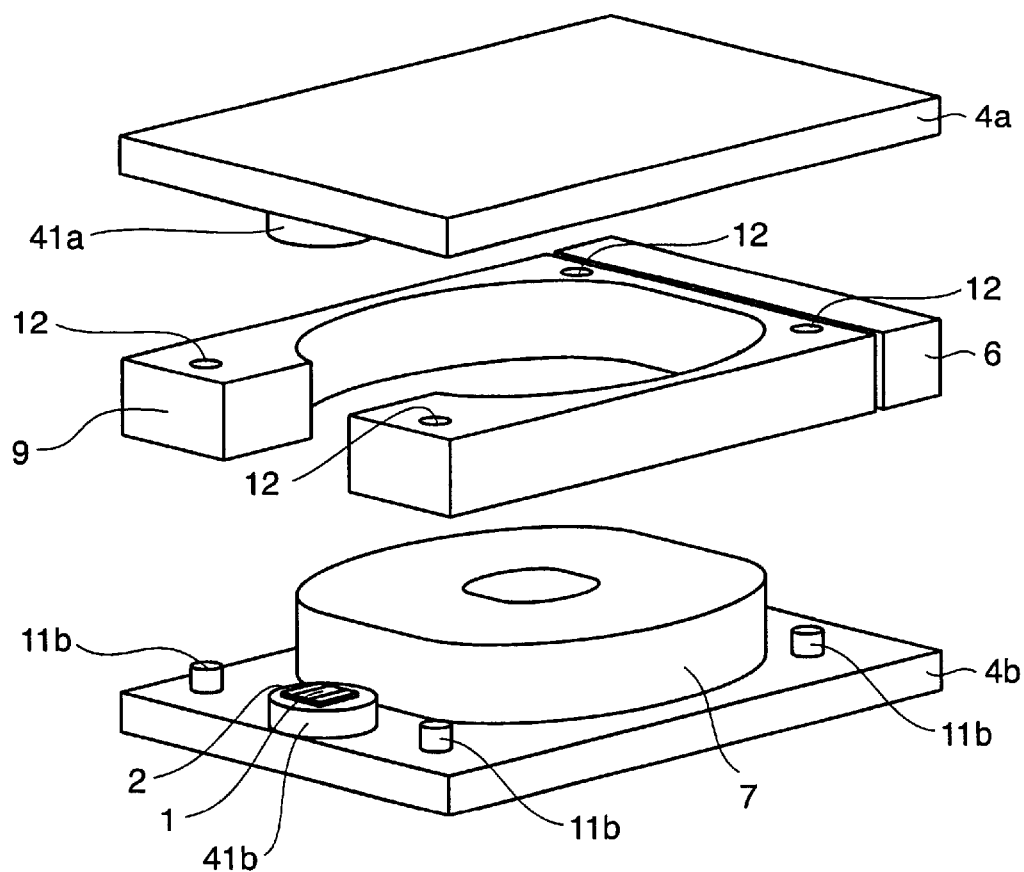

MAGNETOSTATIC WAVE DEVICE

CROSS-REFERENCES TO RELATED APPLICATIONS

This application is a continuation of International PCT Application No. PCT/JP00/02543, filed on Apr. 19, 2000 which claims priority to Japanese patent application Nos. JPAP 11-115086, filed Apr. 22, 1999, JPAP 11-115087, filed Apr. 22, 1999, JPAP 11-115088, filed Apr. 22, 1999, JPAP 2000-75852, filed Mar. 17, 2000 in the Japanese Patent Office.

BACKGROUND OF THE INVENTION

1. Field of the Invention

The present invention relates to magnetostatic wave devices such as magnetostatic resonators, magnetostatic wave filters, etc.

BACKGROUND ART

2. Discussion of the Background

A magnetostatic wave device comprises a ferrimagnetic film formed of YIG or the like, a transducer that is an electrode for radiating electromagnetic waves to the ferrimagnetic film, and a transmission line for feeding high-frequency wave signals to the transducer. As microwave or quasi-microwave signals are supplied to the transducer, the resulting electromagnetic waves propagate in the ferrimagnetic film upon converted to magnetostatic waves. Since the frequency of the magnetostatic waves is dependent on the intensity of an external magnetic field applied to the ferrimagnetic film, the magnetostatic wave device may be allowed to function as a resonator or filter by control of the intensity of the applied magnetic field.

In JP-A's 10-75107 and 11-67540, the inventors have come up with a magnetostatic wave device which can be reduced in size and excellent in function as well. FIGS. 1A and 1B are a perspective view of the magnetostatic wave device set forth in JP-A 11-67540 and a sectional view as taken along the line B—B in FIG. 1A, respectively.

This magnetostatic wave device comprises a ferrimagnetic film 1 for exciting and propagating magnetostatic waves, an RF signal feed line 2 mounted on the surface of the ferrimagnetic film 1, and a magnetic field generator for applying a magnetic field to the ferrimagnetic film 1. The magnetic field generator comprises a permanent magnet 6 for applying a fixed magnetic field to the ferrimagnetic film 1, a coil 7 for applying a variable magnetic field thereto, and a pair of yokes 4a and 4b which are opposite to each other while an air gap with the ferrimagnetic film received therein is provided between them. One ends of the pair of yokes 4a and 4b are opposite to each other with the permanent magnet 6 sandwiched between them and the other ends are opposite to each other with non-magnetic, electrically conductive posts 91 and 92 sandwiched between them. That is, the pair of yokes 4a and 4b are opposite to each other while the air gap with the ferrimagnetic film 1 received therein is provided between them. The posts 91, 92 and the permanent magnet 6 work as supporting members. The yoke 4a is provided with protrusions 41a and 42a whereas the yoke 4b is provided with protrusions 41b and 42b. The opposite protrusions 41a and 41b form together a magnetic pole pair while an air gap 81 with the ferrimagnetic film 1 received therein is provided between them. A conductor film (not shown) is provided all over the surfaces of protrusions 41a and 41b and at least a surface portion of the yoke in the vicinity of protrusions 41a and 41b. The opposite protrusions 42a and 42b, around which a coil winding is wound to from a coil 7, form together a magnetic pole pair while an air gap 82 is provided between them. In this magnetostatic wave device, the length La of the air gap 81 is usually smaller than the height of the permanent magnet 6; a magnetic flux generated from the coil 7 passes primarily through a magnetic path that does not pass through the permanent magnet 6, viz., a magnetic path defined by air gap 82-yoke 4a (protrusion 42a-protrusion 41a)-air gap 81-yoke 4b (protrusion 41b-protrusion 42b), so that a fixed magnetic field due to the permanent magnet 6 and a variable magnetic field due to the coil 7 can be applied to the ferrimagnetic film 1. By control of the amount of currents passing through the coil 7, it is thus possible to change the resonance frequency of magnetostatic waves additively or subtractively from the frequency corresponding to the intensity of the fixed magnetic field. With this magnetostatic wave device, the magnetic resistance of the magnetic path through which the variable magnetic field passes can be reduced because the magnetic flux generated by the coil 7 does hardly pass through the permanent magnet 6. It is thus possible to reduce the number of turns forming the coil and, hence, reduce the overall size of the magnetic circuit. Further, the overall device can be more slimmed down as compared with a device with a permanent magnet in series with a coil. Furthermore, if a plurality of air gaps, each receiving a ferrimagnetic film therein, are disposed with varying lengths, magnetic fields having varying intensities can then be applied to the ferrimagnetic films in the respective air gaps, so that the respective ferrimagnetic films can be excited in resonance at varying frequencies. For instance, this arrangement may be applied to a VOC that oscillates at two or more discrete frequency bands.

Variations in the length La of the air gap 81 or the length Lb of the air gap 82 in the illustrated magnetostatic wave device cause a change in the intensity of the magnetic field in the air gap with the ferrimagnetic film 1 received therein, which may otherwise cause a change in the resonance frequency of magnetostatic waves. Even when external force is applied to this magnetostatic wave device, however, there is a little variation in the gap lengths La and Lb, because one pair of yokes 4a and 4b are supported by the posts 91 and 92.

DISCLOSER OF THE INVENTION

In the magnetostatic wave device having the structure shown in FIGS. 1A and 1B, both end faces of the posts 91 and 92 are bonded to the major surfaces of the yokes 4a and 4b by means of an electrically conductive adhesive layer. However, it is difficult to form this conductive adhesive layer with uniform thickness. Thus, even when the height of each of the magnetic pole-forming protrusions from the major surface of the yoke is within tolerance, the air gap lengths La and Lb often go out of tolerance. Consequently, it is often difficult to fabricate a magnetostatic wave device having a given resonance frequency in high yields. Since this magnetostatic wave device is designed in such a way that one pair of yokes are supported by the magnet 6, the distance between both yokes is affected by the thickness of the magnet 6 as well. However, it is difficult to place the heights of the posts 91 and 92 and the thickness of the magnet 6 simultaneously within tolerance; the air gap lengths are likely to vary.

As the magnetostatic wave device decreases in size, for instance, with each of the yokes 4a and 4b having a major surface size of about 10 mm2 and a thickness of about 0.5 mm, the yokes are susceptible to deflection and warpage and, as a consequence, the air gap lengths are susceptible to variations.

In the conventional magnetostatic wave device as explained above, the posts 91 and 92 that connect one pair of yokes 4a and 4b together are each formed of a nonmagnetic, electrically conductive material for the reasons that any magnetic connection is prevented from being made between both yokes by way of the posts and both yokes are placed at the same potential to reduce high-frequency wave signal losses. However, when each post is all formed of a non-magnetic, electrically conductive metal such as brass or copper, there is an additional increase in the weight of the magnetostatic wave device having heavy parts such as yokes, a permanent magnet and a coil, which leads to another problem that users' demands for weight reductions and slimming-down of electronic parts cannot be met. The electrical resistance of the posts should preferably be as low as possible. However, it is desired to develop means capable of enlarging the surface areas of the posts so as to reduce electrical resistance at high frequencies because high-frequency currents pass only in the vicinity of the surfaces of the posts; they do not reach to deep portions of the posts.

It is here understood that when the posts 91 and 92 are each formed of a lightweight yet non-conductive material such as a ceramic material and provided on its surface with a conductor film for imparting conductivity thereto, any weight increase may be reduced. In this case, too, the means capable of enlarging the surface areas of the posts are still desired.

A first object of the present invention is to reduce variations in the performance of a magnetostatic wave device which enables the size of a magnetic field generator to be reduced with no fluctuation in its performance. A second object of the invention is to achieve weight reductions with reduced signal losses while the first object of the invention is accomplished. A third object of the invention is to achieve reductions in the fabrication cost of the magnetostatic wave device while the first object is accomplished optionally with the second object of the invention. A fourth object of the invention is to provide a magnetostatic wave device which can be easily mounted on electric and electronic equipment while the first object is accomplished optionally with the second object of the invention.

BRIEF DESCRIPTION OF THE DRAWINGS

FIGS. 4A and 4B are fragmentary sectional views of the first aspect of the magnetostatic wave device.

FIG. 5 is an exploded perspective view of the first aspect of the magnetostatic wave device.

DETAILED DESCRIPTION OF THE PREFERRED EMBODIMENTS

Figure 1A:
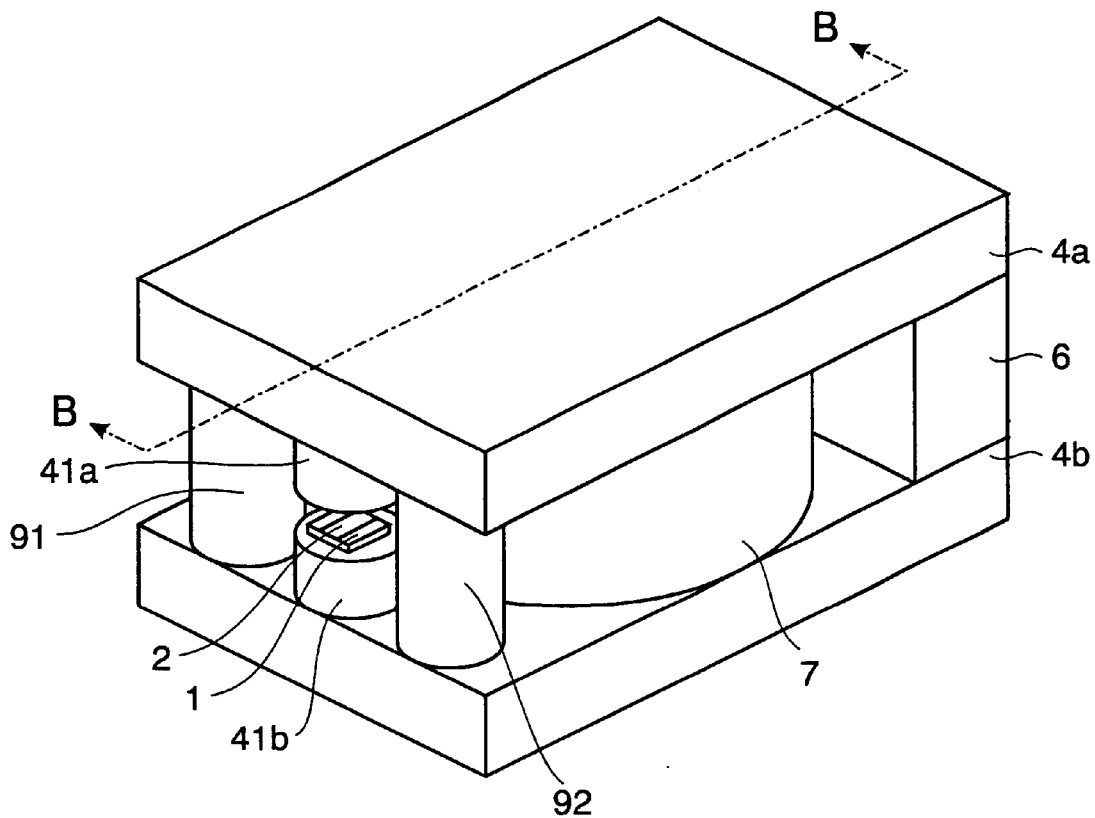
FIG. 1A is a perspective view illustrative of one embodiment of the magnetostatic wave device according to the present invention.
Figure 1B:
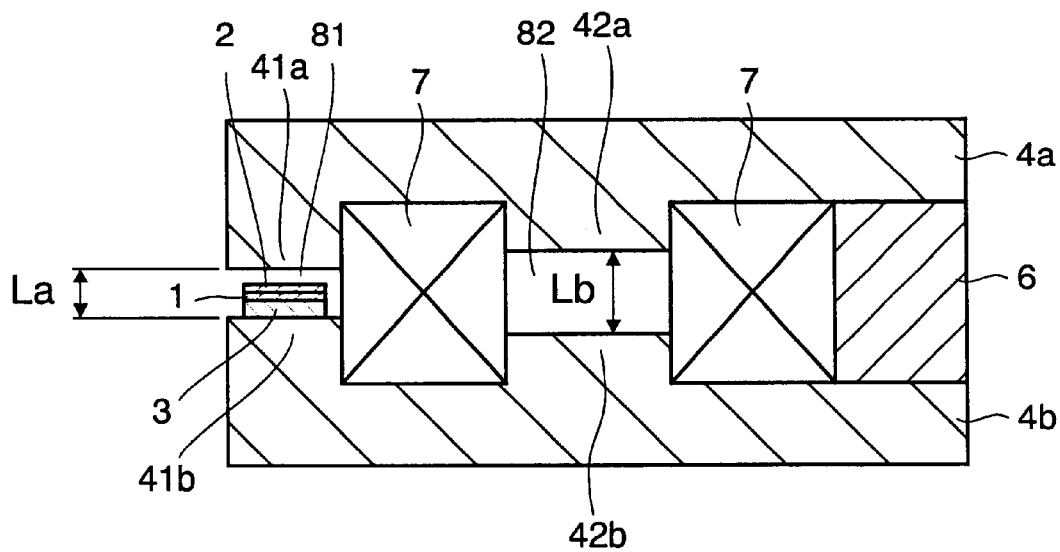
FIG. 1B is a sectional view illustrative of a vertical section of the magnetostatic wave device depicted in FIG. 1A, inclusive of the line B—B.

FIG. 1A is a perspective view illustrative of one embodiment of a magnetostatic wave device to which the present invention is applied. A vertical section of the device inclusive of the line B—B in FIG. 1A is shown in FIG. 1B wherein only one end face of the device is shown except its portion in the depth-wise direction. The magnetostatic wave device of such an appearance type, for instance, is disclosed in JP-A 11-67540 already referred to in the preamble.

The first aspect of the present invention is characterized by the means for fixing yokes 4a and 4b together with posts 91 and 92. The first and second embodiments are embraced in the first aspect of the invention.

FIGS. 2A, 2B and 2C and FIGS. 3A and 3B are sectional views illustrative of the first embodiment, and FIGS. 4A and 4B are sectional views of the second embodiment. In these sectional views, a part of the magnetostatic wave device of FIG. 1A as taken along one plane passing through the post 92 is shown.

First, an account is given of the first embodiment of the present invention. In the first embodiment of the magnetostatic wave device, one pair of yokes are opposite to each other with at least one post formed of a non-magnetic material located between them. The yokes are fixed together with the post by the engagement of at least one protrusion formed on either one of the yokes and the post within at least one recess formed in the other.

Figure 2A:
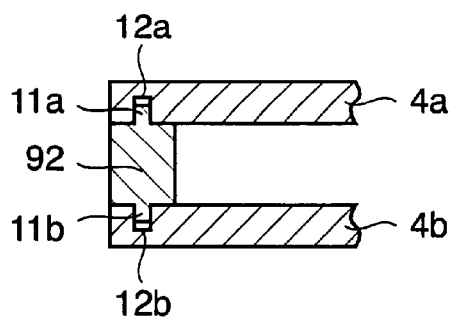
FIGS. 2A, 2B and 2C are fragmentary sectional views of the first aspect of the magnetostatic wave device.
Figure 2B:
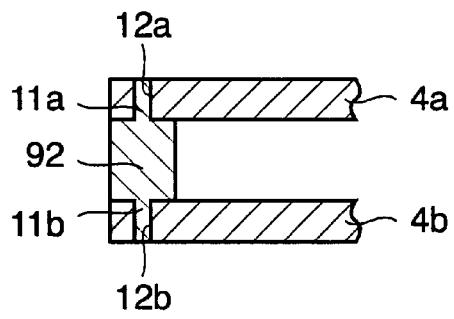

In FIGS. 2A and 2B, protrusions 11a and 11b are provided on both end faces of the post 92 and recesses 12a and 12b are formed in the opposite major surfaces of the yokes 4a and 4b. Thus, the yokes 4a and 4b are fixed together with the post 92 by the engagement of the protrusion 11a into the recess 12a and the protrusion 11b into the recess 12b. The recesses 12a and 12b formed in the yokes 4a and 4b do not extend through the yoke bodies in the case of FIG. 2A, but extend through the yoke bodies in the case of FIG. 2B. If the recesses are provided in the form of through-holes, it is then possible to reduce the weight of the yokes 4a and 4b and, hence, the weight of the 1 magnetostatic wave device. In either embodiment, the yokes and post are fixed together by the engagement of the protrusions into the recesses with no provision of any adhesive agent between both end faces of the post and the major surfaces of yokes. In other words, any performance variations due to thickness variations of an otherwise used adhesive layer are in principle so avoidable that the yield of magnetostatic wave devices can be improved. In FIG. 2A, the heights of the protrusions 11a and 11b are smaller than the depths of the recesses 12a and 12b. With this arrangement, it is possible to eliminate the need of placing the heights of the protrusions 11a and 11b under severe control and, hence, achieve production cost reductions because the distance between one pair of yokes 4a and 4b is determined by the height of the post 92 alone.

Another post 91, too, can be fixed with respect to the yokes by the engagement of protrusions into recesses exactly in the same manner as mentioned above. This will apply hereinafter.

Figure 2C:
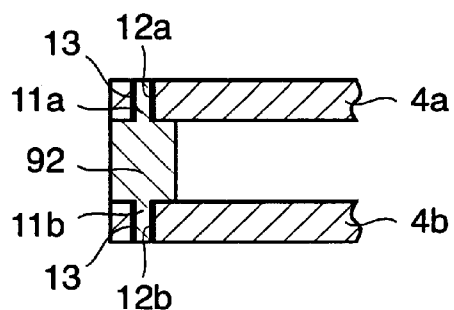
Figure 3A:
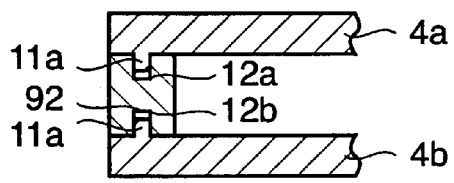
FIGS. 3A and 3B are fragmentary sectional views of the first embodiment of the magnetostatic wave device.
Figure 3B:
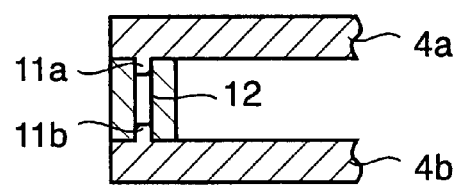

In FIG. 2C, the yokes and post are fixed together as in FIG. 2B with the exception that an adhesive agent 13 is applied to gaps between the outer peripheries of the protrusions 11a, 11b and the inner peripheries of the recesses 12a,12b. According to this arrangement, the post can be more firmly fixed to the yokes by means of the adhesive agent 13. In addition, due to the absence of any adhesive agent between both end faces of the post 92 and the major surfaces of the yokes 4a and 4b, the distance between one pair of yokes 4a and 4b is determined by the height of the post 92 alone and, hence, is unlikely to be affected by thickness variations of an otherwise used adhesive. It is here noted that a part of the adhesive agent 13 often enters between both end faces of the post 92 and the major surfaces of the yokes 4a and 4b; however, such a slight amount of adhesive has little or no influence on the performance of the magnetostatic wave device because the distance between the yokes 4a and 4b hardly changes. In the embodiment shown in FIG. 2A, too, an adhesive agent may be applied between the outer peripheries of the protrusions 1a and 1b and the inner peripheries of the recesses 12a and 12b,if required. When at least the surface portions of the posts 91 and 92 are each formed of an electrically conductive material as will be described later, it is preferable to use an electrically conductive adhesive agent for the adhesive agent 13. For the electrically conductive adhesive agent, for instance, cream solder may be used. In FIGS. 3A and 3B, recesses 12a and 12b are formed in both end faces of a post 92 while protrusions 11a and 11b are formed on the major surfaces of yokes 4a and 4b. The recesses 12a and 12b provided in the post 92 do not extend through the post 92 in the case of FIG. 3A, but extend through the post 92 in the case of FIG. 3B. In either embodiment, the yield of magnetostatic wave devices can be improved because of no need of using any adhesive to fix the post arid yokes together.

In FIGS. 3A and 3B, too, an adhesive agent maybe provided between the outer peripheries of the protrusions 11a and 11b and the inner peripheries of the recesses 12a and 12b,if required.

Next, the second embodiment of the first aspect of the present invention is explained. In the second embodiment of the magnetostatic wave device, a post and yokes are fixed together by the engagement of a rod member into at least recess formed in each of the post and yokes.

In FIG. 4A, recesses 121a and 121b are formed in both end faces of a post 92 and recesses 122a and 122b are formed in the major surfaces of yokes 4a and 4b. The post and yokes are fixed together by the engagement of a rod member 14a into the recesses 121a and 122a and the engagement of a rod member 14b into the recesses 121b and 122b. In FIG. 4B, a recess 121 provided through a post 92 is in the form of a through-hole. By inserting one rod member 14 through yokes 4a, 4b and post 92, the post and yokes are fixed together. In either embodiment, the yield of magnetostatic wave devices can be improved because of no need of using any adhesive to fix the posts and yokes together.

In FIGS. 4A and 4B, an adhesive agent may be applied between the inner peripheries of the recesses and the outer periphery of the rod member, if required.

While, in each of the aforesaid embodiments, one protrusion or recess is provided on or in each end face of each post, it is understood that each end face may be provided with a plurality of protrusions or recesses which cooperate with rod members to fix the post and yokes together. Alternatively, two out of the embodiments shown in the referred-to drawings may be used in combination. For instance, the post may be provided with a protrusion and a recess while the yoke may be provided with a recess and a protrusion corresponding thereto.

The posts 91 and 92 may not magnetically connect one pair of yokes 4a and 4b together; the yokes 4a and 4b should preferably be electrically connected together by the posts 91 and 92. If both yokes are electrically connected together by the posts 91 and 92, the portions of both yokes near to the ferrimagnetic film 1 can then be substantially at the same potential, so that losses of electromagnetic waves jumped from the RF signal-feed line 2 into the yokes having relatively high specific resistance can be reduced.

When both yokes are electrically connected together, it is preferable to form the whole of each post of a nonmagnetic, electrically conductive material such as brass and copper. It is also preferable to make use of a non-magnetic, non-conductive substrate material (e.g., ceramics and resins) with a conductor film formed on its surface. If the posts are formed of ceramics or resins, it is then possible to achieve more weight reductions as compared with metallic posts. In this case, the conductor film should be provided on both end faces of each post as well as on at least a part or, preferably the whole, of its sides for the purpose of making an electrical connection between both its end faces. Besides, it is possible to make use of an electrically conductive substrate material with a conductor film formed on its surface, said conductor film having a specific resistance lower than that of said substrate material.

The conductor film used herein should preferably be made up of Ag, Au, Al or Cu. However, it is acceptable to use alloys containing at least one of these metals. It is here noted that the conductor film may be of either the single layer type or the multilayer type. Preferably but not exclusively, the conductor film should usually be formed by evaporation or plating processes. The conductor film should then have a thickness of the order of 2 to 15 $\mu$m because high-frequency currents pass through only a surface portion of the film.

It is understood that when the recesses in the posts 91 and 92 are each in the form of a through-hole, it is also preferable to provide the conductor film on its inner periphery. This is favorable to place the portions of one pair of yokes 4a and 4b near to the ferrimagnetic film 1 at the same potential, because the electrical resistance between both yokes becomes low. When the rod members 14, 14a and 14b are used as shown in FIGS. 4A and 4B, it is preferable for similar reasons to make electrical connections between the yokes and the posts by means of those rod members. In this case, each rod member itself may be formed of an electrically conductive material or, alternatively, each rod member may be provided with the conductor film at least on its outer periphery, as explained with reference to the posts.

Preferably, the yokes 4a and 4b should be each provided on its surface with a conductor film. By the electrical connection of the electrically conductive posts 91 and 92 to the conductor films provided on the surfaces of the yokes, one pair of magnetic poles opposite to each other with the air gap 81 located between them can be placed at the same potential, so that losses of electromagnetic waves can be reduced for the reason of prevention of entrance of electromagnetic waves from the RF signal feed line 2 into the yokes 4a and 4b of relatively high specific resistance. The material, thickness, etc. of each conductor film and how to form it may be similar to those explained with reference to each post. For instance, when the conductor used is formed of Au or Cu, calculated values of the depth with which electromagnetic waves can enter into the conductor are about 0.65 $\mu$m or less for a microwave of 10 GHz or more, and about 3 $\mu$m or less for a quasi-microwave of 700 MHZ or more. In expectation of a value three to five times as large as the aforesaid calculated values, therefore, the preferable thickness of the conductor film is in the range of 2 to 15 $\mu$m as already mentioned. For instance, the conductor film provided on the surface of the protrusion 41b may be used as a grounding conductor. The conductor film may be of either the single layer type or the multilayer type. It is not always necessary to provide this conductor film all over the surface of each yoke; however, the conductor film should be provided, at least, on the surfaces of the magnetic poles (protrusions 41a and 41b in the illustrated embodiments) and in the vicinity thereof.

In the embodiment shown in FIG. 1A, two posts 91 and 92, each in a cylindrical column form, are positioned in the vicinity of the protrusions 41a and 41b in such a way that they are sandwiched between the protrusions. Thus, this embodiment ensures a structure having a mechanical strength so high that the air gap length La is less susceptible to changes even upon receipt of external force. However, it is noted that the number of posts is not limited to two; one or, at least three posts may be used. The post may be not only of a circular shape, but also of an elliptic, polygonal, square or other shape, in section. For instance, the posts may be configured in such a way that not only the ferrimagnetic film 1 but the coil 7 and even the permanent magnet 6 as well are surrounded therewith.

FIG. 5 is illustrative of one embodiment of the magnetostatic wave device including a post 9 configured in such a way as to surround a ferrimagnetic film 1 and a coil 7. In this embodiment, one pair of yokes 4a and 4b and the post 9 are fixed together by use of the arrangement shown in FIG. 3B. Since, in this embodiment, nearly all portions of the opposing major surfaces of one pair of yokes 4a and 4b are supported by the post 9, variations of air gap lengths La and Lb due to deflections or warpage of the yokes 4a and 4b can be reduced even when the yokes 4a and 4a are thinned. If, in this case, the thickness of a magnet 6 is somewhat reduced in such a way that one pair of yokes 4a and 4b are supported by the post 9 alone, viz., only the post 9 is allowed to function a spacer for the yokes, only thickness control of the post 9 is then required, because the air gap lengths La and Lb are not affected by the thickness of the a magnet 6 whatsoever. In FIG. 5, the area of contact of the post 9 with the yokes 4a and 4b is so large that the yokes can be easily fixed in place with the opposing surfaces kept parallel with each other, resulting in reductions of performance variations due to assembly errors and, hence, yield improvements with production cost reductions. It is here understood that even when the post is configured in such a way as to surround not only the coil 7 but the permanent magnet 6 as well, similar effects are obtainable, and that even when the post 9 shown in FIG. 5 is divided into a plurality of pieces, viz., even when a plurality of posts are positioned in such a way as to support nearly all portions of the opposing major surfaces of one pair of yokes, similar effects are again obtainable.

When the post configured in such a way as to surround the ferrimagnetic film 1 is used, there is provided an opening such as a notch or through-hole through which a power supply line is passed to communicate the ferrimagnetic film with an external circuit. When the post configured in such a way as to surround even the coil 7 is used, the lead of the coil may be drawn together with the aforesaid power supply line out of the aforesaid opening. Alternatively, there may be provided an independent opening for drawing out the lead of the coil. Otherwise, the embodiment of the magnetostatic wave device shown in FIG. 5 is similar to that of the magnetostatic wave device shown in FIGS. 1A and 1B.

In each of the embodiments explained above, at least one additional recess (preferably in a through-hole form) with no protrusion engaged in it may be provided in the post 9, 91, and 92 for weight reductions. When such a through hole is provided, it is preferable to form the aforesaid conductor on its inner periphery.

Next, the second aspect of the present invention is explained. In the magnetostatic wave device according to the second aspect of the invention, at least one through hole is extended through a post for connecting together both its end faces contiguous to the major surfaces of yokes. Then, the post and one pair of yokes are fixed together with an adhesive agent that is present at least in the through-hole.

In the second aspect of the present invention, the yokes and the post are fixed together with the adhesive agent filled in the through-hole. Since there is thus no, or a slight if any, adhesive agent between the major surfaces of the yokes and the end faces of the post, the performance variation of the magnetostatic wave device due to thickness variations of an otherwise used adhesive layer can be much more reduced than that of the aforesaid conventional magnetostatic wave device.

According to the second aspect of the invention, the weight of the post can be reduced by the provision of the through-hole. Thus, the provision of the through-hole is effective especially for the post formed of a metal.

In addition, the provision of the through-hole enables the surface area of the post to be so increased that the electrical resistance of the post in a high-frequency range can be decreased. It is here understood that this effect is obtainable irrespective of whether the post is overall formed of an electrically conductive material or the post is constructed of an insulating substrate material with a conductor film formed on its surface.

With a number of relatively fine posts, it is also possible to decrease the overall weight of the posts and increase the surface area of the posts. In this case, however, performance variations become noticeable because of the need of providing adhesive layers between both end faces of the posts and the yokes. Further, the provision of a number of posts makes the assembly of magnetostatic wave devices very clumsy. Furthermore, production costs rise because, to reduce variations in the distance between magnetic poles, the heights of all posts must be placed under strict control.

According to the second aspect of the present invention wherein weight reductions and surface are increases are achieved by the provision of the through-hole in the post, the same weight reduction and surface area increase as in the prior art can be achieved with a much smaller number of posts than required so far in the art, so that height control of the post is easily gained with yield improvements. In addition, the assembly of magnetostatic wave devices can become easier.

Figure 6A:
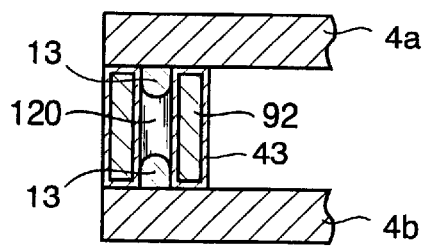
FIGS. 6A and 6B are fragmentary sectional views of the second aspect of the magnetostatic wave device.
Figure 6B:
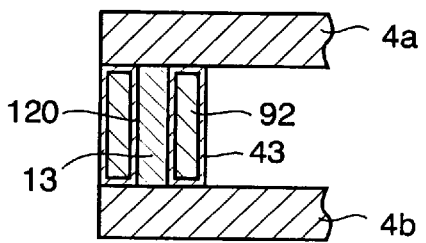

FIGS. 6A and 6B are fragmentary sectional views of the magnetostatic wave device according to the second aspect shown in FIG. 1A, as taken along a plane passing through the axis of the post 92.

In FIGS. 6A and 6B, a through-hole 120 is extended through a post 92 to connect together both its end faces contiguous to the major surfaces of yokes 4a and 4b. The post 92 is fixed to the yokes 4a and 4b by an adhesive agent 13 filled in the through-hole 120. The post 92 is constructed of a cylindrical column form of substrate having the through-hole 120 therein, which substrate is provided with a conductor film 43 all over the surface. In other words, the two end faces and outer periphery of the post 92 and the inner periphery of the through-hole 120 are formed of the conductor film 43. This conductor film is the same as that explained with reference to the first aspect of the invention.

FIG. 6A is illustrative of how the adhesive agent 13 is poured from openings at both ends of the through-hole 120 to bond the yokes to the post. Within the through-hole 120 there is an air gap. FIG. 6B is illustrative of the adhesive agent 13 charged in the whole of the through-hole 120. In either case, such effects as mentioned above are achievable due to the absence of any adhesive agent between both end faces of the post 92 and the major surfaces of the yokes 4a and 4b.

It is here noted that during bonding, a part of the adhesive agent 13 often enters between both end faces of the post 92 and the major surfaces of the yokes 4a and 4b; however, such a slight amount of adhesive has little or no influence on the performance of the magnetostatic wave device because the distance between the yokes 4a and 4b remains nearly unchanged. When the surface portions of the posts 91 and 92 are each formed of an electrically conductive material as will be described later, it is preferable to use an electrically conductive adhesive agent for the adhesive agent 13. For the electrically conductive adhesive agent, for instance, cream solder may be used.

The arrangement required to make an electrical connection between one pair of yokes for each of the posts 91 and 92 is the same as in the first aspect of the present invention. It is preferable, to form the conductor film 43 all over the inner periphery of the through-hole 12 as shown in FIGS. 6A and 6B, because the electrical resistance of the post in a high-frequency range can then be strikingly reduced.

Figure 7:
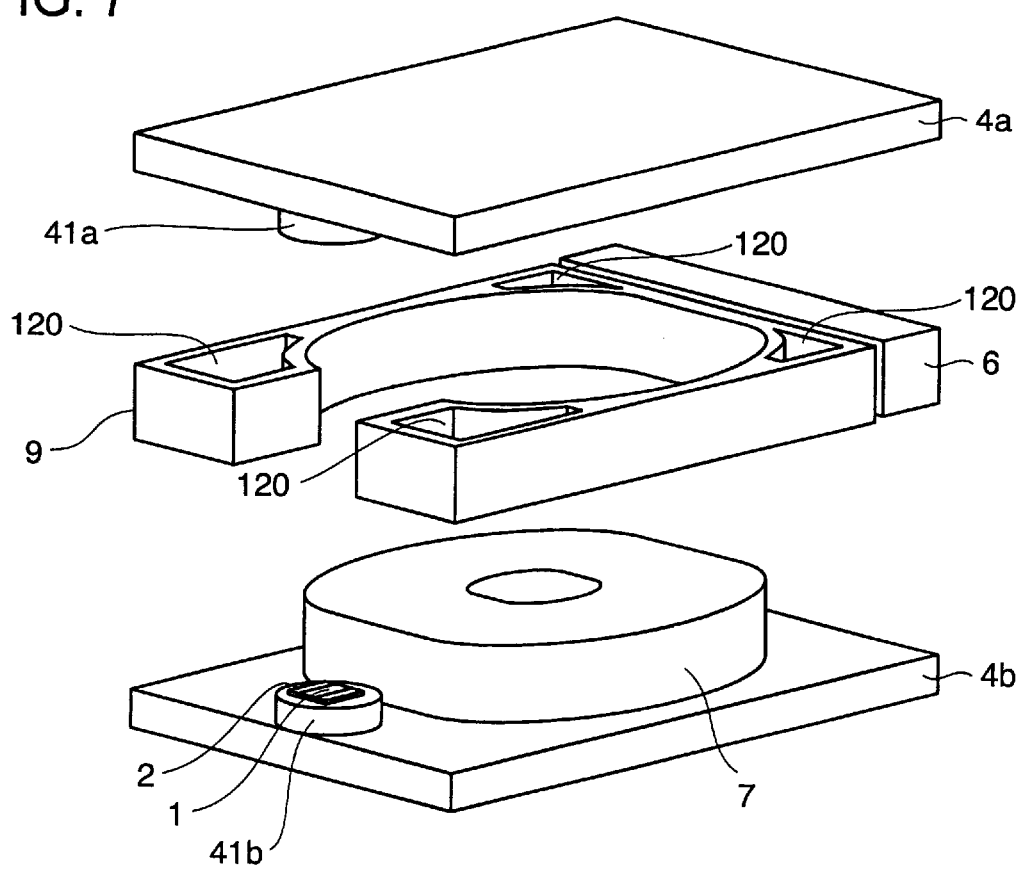
FIG. 7 is an exploded perspective view of the second aspect of the magnetostatic wave device.

The number and shape of the posts used herein are not critical as in the first aspect of the present invention; for instance, it is acceptable to make use of the post the structure of which is shown in FIG. 7. The post 9 shown in FIG. 7 is provided with a through-hole 120 in place of the recess 12 shown in FIG. 5.

One or plural through-holes may be provided per post, and the through-hole may be of a circular, elliptic, square, irregular or other shape in section. The number and sectional shape of through-holes and the area ratio of the post section occupied by the through-hole may be appropriately determined depending on the sectional shape of the post, etc. in such a way as to allow the post to have sufficient mechanical strength and gain sufficient weight reductions and surface area increases. In FIGS. 6A and 6B, for instance, one through-hole of a circular shape in section is extended through a cylindrical column form of post, and in FIG. 7, a frame form of post 9 is provided with four through-holes 120, each conforming in section to the post.

No particular limitation is imposed on how to fabricate the magnetostatic wave devices according to the first and second aspects of the present invention as explained above; however, it is preferable to fabricate them as follows. First, a sheet member formed of a magnetic material such as iron is pressed using a matrix to form protrusions that provide magnetic poles. Then, such a conductor film as already mentioned is formed on the surface of each yoke, if required. The thickness difference of the conductor film across the surface of the yoke should preferably be limited to 1 μm or less. Then, a coil, a permanent magnet and a post are incorporated between one pair of yokes. Finally, a ferrimagnetic film with an RF signal feed line formed on its surface is located between the magnetic poles, thereby obtaining a magnetostatic wave device.

In what follows, the third aspect of the present invention is explained. The third aspect of the invention is applied to a magnetostatic wave device wherein the limitations of the first and second aspects of the invention are incorporated. In the third aspect of the invention, each of one pair of yokes comprises a sheet form of yoke body and at least one protrusion that extends from the yoke body toward another yoke body. Each protrusion and a part of the surface of another yoke body opposite thereto form together a magnetic pole pair with an air gap located across it. A ferrimagnetic film is disposed in an air gap located across at least one magnetic pole pair.

One prior art relating to the third aspect of the present invention is explained. In FIGS. 1A and 1B, the protrusions 41a, 41b, 42a and 42b are formed integrally with yoke bodies by means of grinding or other configuring process. Since, in this case, the distance La between the protrusions 41a and 41b is different from the distance Lb between the protrusions 42a and 42b, each yoke should be provided with two protrusions varying in height. However, it is very difficult to form such protrusions having different heights integrally with the yoke body in such a way that their dimensions come within a prescribed dimensional range. After grinding, yokes with their protrusion dimensions coming within the prescribed dimensional range are sorted out. The thus sorted out yoke has two protrusions whose dimensions are within the prescribed dimensional range. However, the provability of occurrence of such yokes is low, resulting unavoidably in low yields and, hence, cost increases.

For the reason that the yield of the first grinding run is low, it is required to polish yokes with their protrusion heights going out of the prescribed dimensional range, thereby allowing the protrusion heights to come within the prescribed dimensional range. In this case, two protrusions formed on each yoke with varying heights must be polished with high accuracy. However, such polishing work is very hard to carry out, resulting again in cost increases.

Figure 8A:
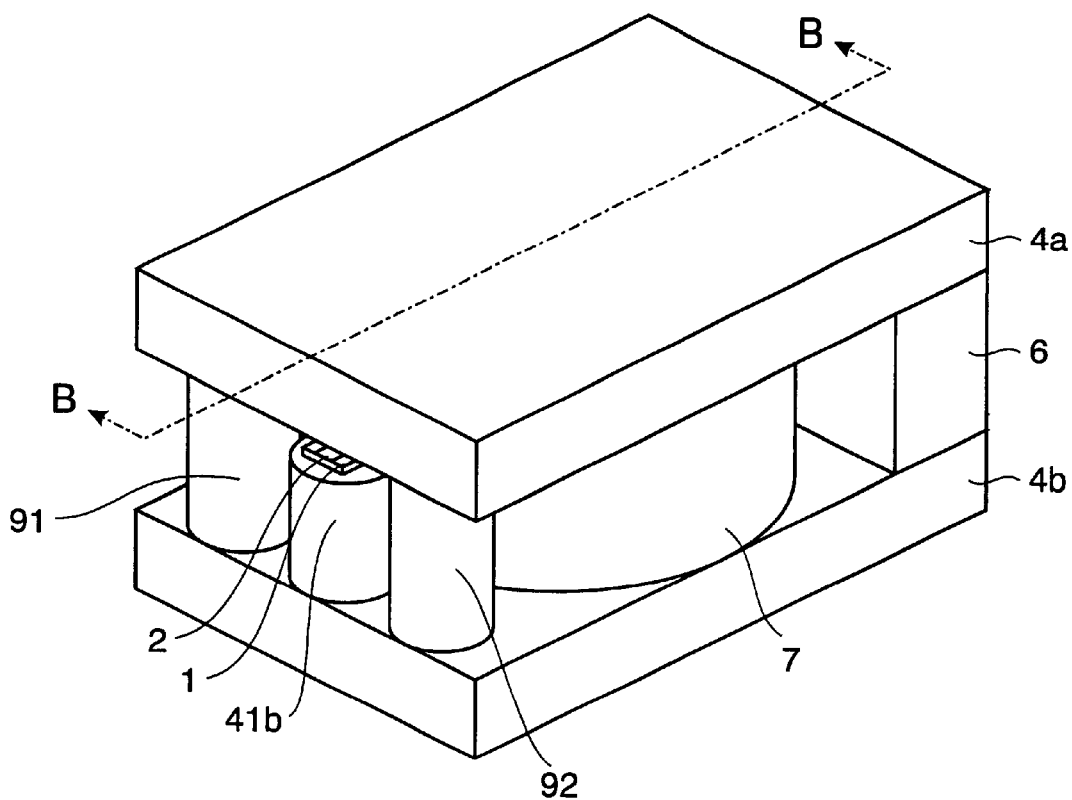
FIG. 8A is a perspective view illustrative of one embodiment of the third aspect of the magnetostatic wave device.
Figure 8B:
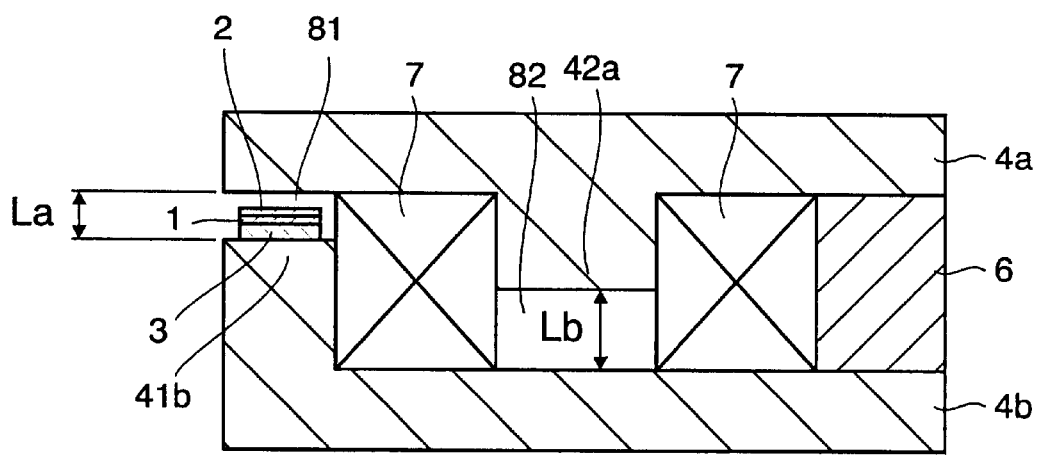
FIG. 8B is a sectional view illustrative of a vertical section of the magnetostatic wave device depicted in FIG. 8A, inclusive of the line B—B.

Such a problem can be solved by use of the third aspect of the present invention. One typical embodiment of the magnetostatic wave device according to the third aspect of the invention is shown in FIG. 8A that is a perspective view thereof, and in FIG. 8B that is a sectional view thereof as taken along the line B—B. In FIG. 8B, it is noted that only an end face of the device is shown; any portion thereof in its depth-wise direction is not shown. This magnetostatic wave device comprises a ferrimagnetic film 1 for exciting and propagating magnetostatic waves, an RF signal feed line 2 provided on the surface of the ferri-magnetic film 1 and a magnetic field generator for applying a magnetic field to the ferrimagnetic film 1. The magnetic field generator comprises one pair of yokes 4a and 4b, a permanent magnet 6 and a coil 7. The pair of yokes 4a and 4b are opposite to each other while the permanent magnet 6 is sandwiched therebetween on one end sides and electrically conductive posts 91 and 92 are interposed therebetween on the other sides. Each yoke comprises a sheet form of yoke body and a protrusion that extends from the yoke body toward another yoke body. One end of each yoke is magnetically connected to the permanent magnet 6. One yoke 4b is provided at the other end with a protrusion 41b and another yoke 4a is provided in the vicinity of its center with a protrusion 42a, around which a coil winding is wound to form the coil 7.

In this magnetostatic wave device, the protrusion 41b and an area of the surface of the opposite yoke 4a (yoke body) that is opposite to the protrusion 41b form together a first magnetic pole pair, and the protrusion 42a and an area of the surface of the opposite yoke 4b (yoke body) that is opposite to the protrusion 42a form together a second magnet pole pair. Across the first magnetic pole pair there is an air gap 81 having an air gap length La, and across the second magnetic pole pair there is an air gap 82 having an air gap length Lb. In the third aspect of the present invention, one magnetic pole pair is set up by one magnetic pole defined by a protrusion formed on one yoke alone and the other magnetic pole pair defined by a portion of the surface of another yoke body opposite to this protrusion.

According to the illustrated embodiment, it is easy to configure yokes and, hence, reduce their production costs, because each yoke is provided with only one protrusion to form a magnetic: pole.

In sorting out a yoke coming within a certain dimensional accuracy range, a yoke with one protrusion is much higher in yields than a conventional yoke with two or more protrusions, even when their configuring accuracy is on the same level, as explained specifically below.

Now let P1 represent a probability with which, when a yoke is provided with one protrusion, the height of the yoke from its major surface to the tip of the protrusion (the surface of a magnetic pole) comes within a prescribed dimensional range. When one yoke is provided with two protrusions varying in height, the probability with which the heights of both protrusions come within the prescribed dimensional range is less than P1 or nearly equal to P1×P1, although the actual probability varies with configuring processes. The yield of magnetostatic wave devices with their inter-magnetic pole distance coming within a prescribed range is considerably low because they are fabricated by a combination of two yokes with both protrusions coming within the prescribed dimensional range.

Figure 9A:
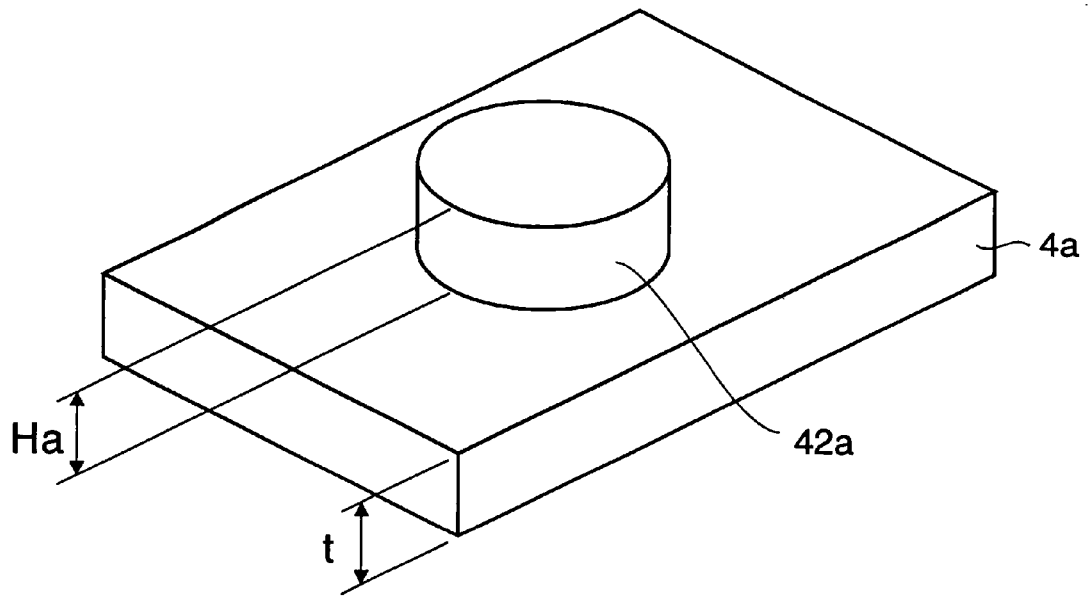
FIG. 9A is a perspective view illustrative of one embodiment of the yoke used in the third aspect.
Figure 9B:
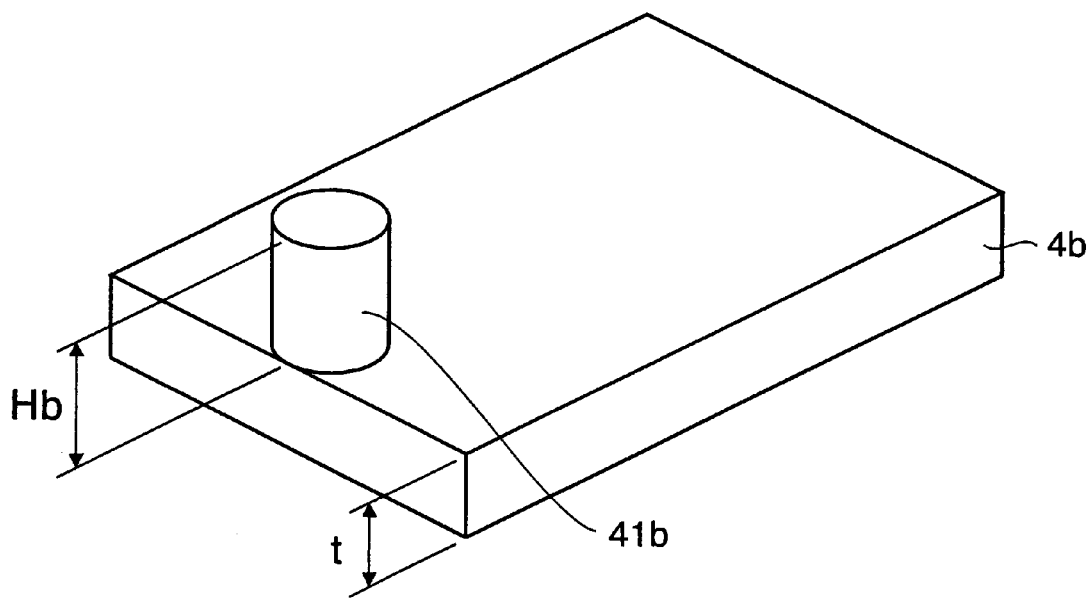
FIG. 9B is a perspective view of one embodiment of another yoke.

When the yokes 4a and 4b are each provided with only one protrusion as shown in FIGS. 9A and 9B, on the other hand, a yoke with its protrusion height coming within the prescribed range is obtainable with the probability P1. It is thus possible to fabricate a magnetostatic wave device with the inter-magnetic pole distance coming within the prescribed range in high yields.

When a yoke with two protrusions of varying heights is controlled by polishing in terms of protrusion height, it is difficult to polish both protrusions simultaneously with high accuracy. In addition, it is substantially impossible to polish a number of yokes at the same time. By contrast, a yoke with one protrusion can not only be very easily polished to place its height under high-accuracy control, but a number of such yokes can also be polished at the same time. It is thus possible to achieve considerable polishing cost reductions.

While the third aspect of the present invention has been explained with reference to two magnetic pole pairs, it is understood that even if three or more magnetic pole pairs are used, it is possible to achieve high yields. In a conventional magnetostatic wave device, protrusions twice as many as magnetic pole pairs must be provided on both yokes. According to the third aspect of the invention, however, it is possible to provide as many protrusions as magnetic pole pairs; even when a plurality of protrusions are provided on at least one yoke in the third aspect of the invention, higher yields are achievable when compared with a conventional magnetostatic wave device having the same total number of magnetic poles.

In what follows, how to fabricate the magnetostatic wave device according to the third aspect of the present invention is explained.

First, a sheet form of members formed of a magnetic material such as iron are pressed using a matrix or otherwise configured to form protrusions that provide magnetic poles, thereby obtaining a yoke 4a as shown in FIG. 9A and a yoke 4b as shown in FIG. 9B. Then, the height Hb of protrusion 41b and the height Ha of protrusion 42a are measured. Yokes with their protrusion height coming within the prescribed dimensional range are sorted into a group. This is here called group A. Each yoke in this group A is provided at least on its surface with the aforesaid conductor film, if required. The thickness difference of the conductor film across the surface of the yoke should be limited to 1 $\mu$m or less. Then, a coil, a permanent magnet and posts are incorporated between one pair of yokes.

Finally, a ferri-magnetic film with an RF signal feed line formed on its surface is interposed between the magnetic poles, thereby obtaining such a magnetostatic wave device as shown in FIGS. 8A and 8b.

From a group of yokes with the heights Ha and Hb going out of the prescribed dimensional range, yokes with Ha and Hb greater than the prescribed height are sorted into a group. This is here called group B. From yokes belonging to group B, yokes wherein the thicknesses of yoke bodies come within the prescribed dimensional range are sorted into a group here called group C. A yoke belonging to group C is fixed to a keeper at its major surface that faces away from its surface with a protrusion formed thereon. In this state, the upper face of the protrusion is polished in such a way that Ha or Hb comes within the prescribed range. In this case, a plurality of yokes can be polished at the same time, as already mentioned. Then, the yokes are washed and subjected to post-treatments and, if required, provided with conductor films, as in the case of group A. Finally, magnetostatic wave devices are set up.

It is understood that yokes belonging to group B out of which group C has not been sorted may be polished for correction of Ha or Hb. In this case, however, it is noted that a plurality of yokes cannot be polished at the same time. When a plurality of yokes are simultaneously polished while they are fixed to keepers, the height (t+Ha or t+Hb) of the surface of each keeper to the tip of the protrusion can always be the same for each yoke. However, the same consistent Ha or Hb is not always obtained. When a plurality of yokes are simultaneously polished, it is thus required to pick up group C with t coming within the prescribed dimensional range.

When a magnetostatic wave device is mounted on electric and electronic equipment, it is required that a high frequency circuit for feeding RF signals to a ferrimagnetic film and a coil control circuit for feeding variable currents to a coil be electrically connected to the magnetostatic wave device. However, the aforesaid JP-A's 10-75107 and 11-67540 disclose nothing about how such parts are actually connected to the magnetostatic wave device when it is mounted.

To facilitate the mounting of the magnetostatic wave device according to the present invention, it is thus preferable to make use of the fourth aspect of the invention as explained below. The fourth aspect of the invention is applied to a magnetostatic wave device constructed, at least, according to the first or second aspect of the invention.

Figure 10A:
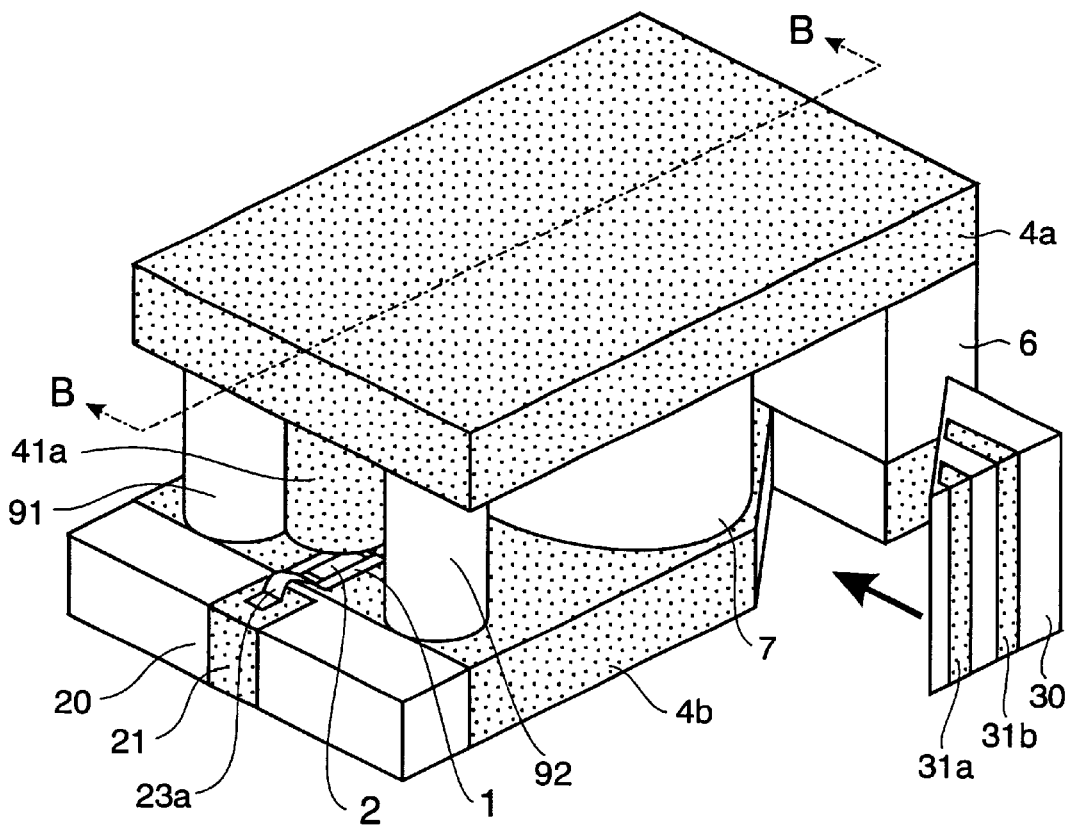
FIG. 10A is a perspective view illustrative of one embodiment of the fourth aspect of the magnetostatic wave device.
Figure 10B:
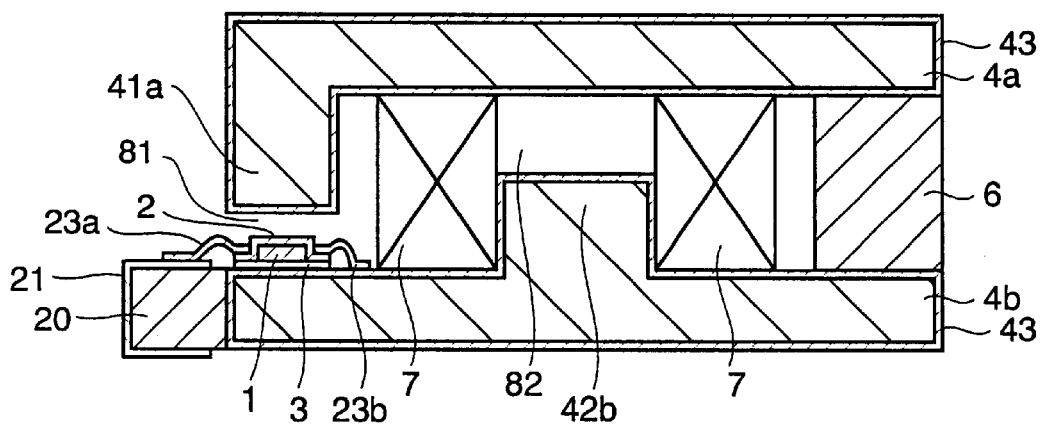
FIG. 10B is a sectional view illustrative of a vertical section of the magnetostatic wave device depicted in FIG. 10A, inclusive of the line B—B.

FIG. 10A is illustrative of one embodiment of the magnetostatic wave device according to the fourth aspect of the invention, which functions as a resonator. FIG. 10B is a vertically sectional view of the magnetostatic wave device as taken along the line B—B. In FIG. 10B, it is noted that only an end face of the device is shown; any portion thereof in its depth-wise direction is not shown.

This magnetostatic wave device comprises a ferrimagnetic film 1 for exciting and propagating magnetostatic waves, an RF signal feed line 2 provided on the surface of the ferrimagnetic film 1 and a magnetic field generator for applying a magnetic field to the j ferrimagnetic film 1. The magnetic field generator comprises one pair of yokes 4a and 4b, a permanent magnet 6 and a coil 7. The pair of yokes 4a and 4b are opposite to each other while the permanent magnet 6 is sandwiched therebetween on one end sides and electrically conductive posts 91 and 92 are interposed therebetween on the other sides. Each yoke comprises a sheet form of yoke body and a protrusion that extends from the yoke body toward another yoke body. One end of each yoke is magnetically connected to the permanent magnet 6. One yoke 4a is provided at the other end with a protrusion 41a and another yoke 4b is provided in the vicinity of its center with a protrusion 42b, around which a coil winding is wound to form the coil 7.

The coil 7 is provided to generate a variable magnetic field as well as to control the intensity of the d.c. magnetic field applied to the ferrimagnetic film 1.

In this magnetostatic wave device, the protrusion 41a and the surface of the yoke 4b opposite to the protrusion 41a with an air gap 81 located between them form together a first magnetic pole pair, and the protrusion 42b and the surface of the yoke 4a opposite to the protrusion 42b with an air gap 82 located between them form together a second magnetic pole pair. In other words, this device is constructed according to the third aspect of the present invention. Within the air gap 81 there is received the ferrimagnetic film 1 formed of YIG or the like. The yokes 4a and 4b are each provided with a conductor film 43 all over the surface.

In the vicinity of the ferrimagnetic film 1, an insulating member 20 is fixed to the yoke 4b by means of an adhesive agent (not shown). A part of the area of the surface of the insulating member 20, except its surface area opposite to the yoke 4b, is provided with a conductor pattern 21 for signals, which terminates at the lower surface of the insulating member 20 upon turned-back. This conductor pattern 21 for signals is electrically connected to the RF signal feed line 2 by way of one ribbon-like conduction line 23a. The RF signal feed line 2 is grounded at the conductor film 43 on the surface of the yoke 4b by way of another ribbon-like conduction line 23b.

No particular limitation is imposed on the conductor pattern 21 for signals with the exception that it should be electrically connected to the yoke 4b and terminate at the lower surface of the insulating member 20 upon turned-back. While only one conductor pattern for signals is provided in the illustrated embodiment, it is understood that when two RF signal feed lines are connected to the ferrimagnetic film 1 or when two or more ferrimagnetic films are provided, each with an RF signal feed line connected to it, the number of conductor patterns for signals may be determined depending on the number of RF signal feed lines.

It is noted that the ribbon-like conduction lines 23a and 23b used for the connection of the RF signal feed line 2 to the conductor pattern 21 and conductor film 43, respectively, may be Au ribbon lines provided by wire bonding, etc., or Cu strip foils bonded by an electrically conductive adhesive agent such as cream solder, etc.

The adhesive agent used to fix the insulating member 20 to the yoke 4b may be of either the electrically conductive type or the electrical insulating type.

While the insulating member 20 used in the illustrated embodiment is of a cuboidal shape, it is understood that the shape of the insulating member 20 is not critical on condition that it is not detrimental to the action and effect of the fourth aspect of the present invention. The material constituting the insulating member used in the fourth aspect of the invention is not critical; for instance, an appropriate selection may be made from ceramics and resins.

In the vicinity of the coil 7, the second insulating member 30 is fixed to the yoke 4b by means of an adhesive agent (not shown). The second insulating member 30 is provided on its surface with conductor patterns 31a and 31b for the coil, which terminate at its lower surface of the second insulating member upon turned-back. The conductor patterns 31a and 31b for the coil are each electrically connected with the lead of the coil 7 (not shown). The conductor patterns 31a and 31b are not critical with the exception that they are electrically insulated from the yoke 4b and terminate at the lower surface of the second insulating member 30 upon turned-back. The adhesive agent for the fixation of the second insulating member 30 to the yoke 4b may be of either of the electrically conductive type or the electrical insulating type.

In the illustrated embodiment, the yoke 4b is provided with a wedgy notch, and by conforming the second insulating member 30 to the notch, it is possible to prevent any prominence from projecting from the surface of the yoke when the second insulating member 30 is fixed to the yoke. This in turn enables the magnetostatic wave device to decrease in size and become easy to handle. The notch used herein may be of other shape. When the height of the second insulating member 30 is increased, another yoke 4a, too, may be provided with a notch, if required, for the purpose of preventing any contact of the conductor patterns 31a and 31b for the coil with the yoke 4a. In this regard, it is understood that the provision of these notches in the yokes is not essential to the practice of the present invention.

In the magnetostatic wave device shown in FIGS. 10A and 10B, the conductor pattern 21 for signals that defines the base end of the power supply line to the ferrimagnetic film 1 exists on the lower surface of the insulating member 20, and the conductor patterns 31a and 31b for the coil that define the base ends of the power supply line to the coil 7 exist on the lower surface of the insulating member 30.

Accordingly, this magnetostatic wave device, when mounted on an interconnecting substrate, may be treated as a so-called surface mount device. In this case, the conductor patterns provided on the insulating members are electrically connected to a pad electrode provided on the interconnecting substrate. In addition to the magnetostatic wave device, the interconnecting substrate is mounted thereon with a high-frequency circuit for feeding RF signals to the ferrimagnetic film 1 and a coil control circuit for feeding a variable current to the coil 7.

In a certain case, an electrical insulating protective film is often provided on the surface of each yoke. In this case, however, it is difficult to connect the yoke to a ground when it is mounted on the interconnecting substrate. Therefore, it is then preferable to connect the yoke directly to a ground while no insulating protective film is provided on the bottom of the yoke contiguous to the interconnecting substrate and on at least a part of the sides of the yoke and, instead, a grounding conductor pattern is provided on the surface of the interconnecting substrate.

Figure 11:
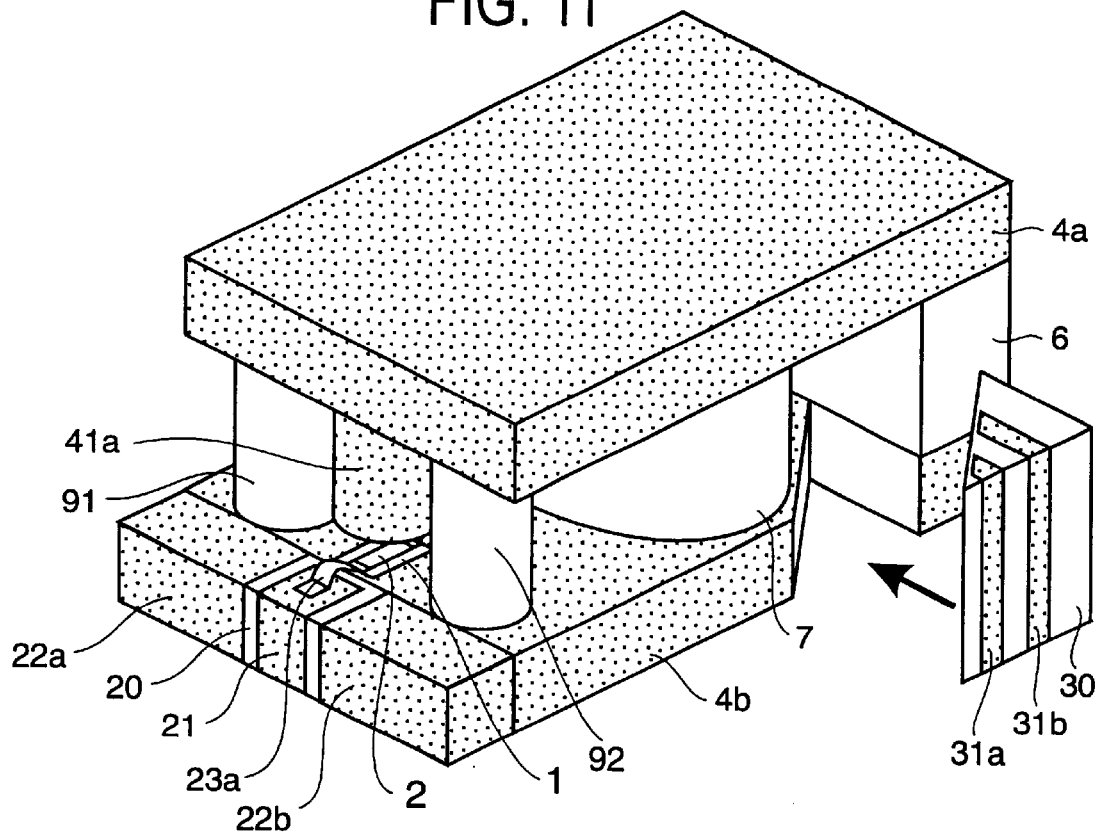
FIG. 11 is an exploded perspective view illustrative of one embodiment of the fourth aspect of the magnetostatic wave device.

Even when the insulating protective film is applied all over the surface of the yoke, however, the yoke can be grounded by use of the embodiment shown in FIG. 11. The magnetostatic wave device depicted in FIG. 11 is constructed as is the case with that depicted in FIG. 10 with the exception that an insulating member 20 is provided on its surface with grounding conductor patterns 22a and 22b, and fixed to a yoke 4b by means of an electrically conductive adhesive agent. The grounding conductor patterns 22a and 22b are formed on both sides of a conductor pattern 21 for signals, and electrically insulated therefrom. In addition, these conductor patterns for signals are provided astride five out of the (6) surfaces of the cuboidal insulating member 20. However, these grounding conductor patterns are not limited to those illustrated; any desired patterns may be used provided that they are electrically insulated from the conductor pattern 21 for signals and electrically connected to the yoke 4b, and terminate at the lower surface of the insulating member 20 upon turned-back. According to this embodiment, the yoke 4b may be connected to a ground by way of the grounding conductor patterns 22a and 22b. While, in the illustrated embodiment, the grounding patterns 22a and 22b are provided on the insulating member 20 as in the case of the conductor pattern 21 for signals, it is understood that it is not always necessary to provide there patterns on the same insulating member. In other words, the grounding conductor patterns may be formed on the second insulating member 30 or on the surface of an additionally provided insulating member.

The illustrated grounding conductor patterns 22a and 22b, because of existing with the conductor pattern 21 for signals interposed between them, also function as shielding conductors for shielding off electromagnetic waves radiated from the conductor pattern 21 for signals. When these grounding conductor patterns are allowed to function as only the shielding conductor patterns, it is unnecessary to connect them electrically to the yoke. However, the shielding conductor patterns must be electrically connected to a grounding conductor pattern on an interconnecting substrate on which the magnetostatic wave device is mounted.

Figure 13:
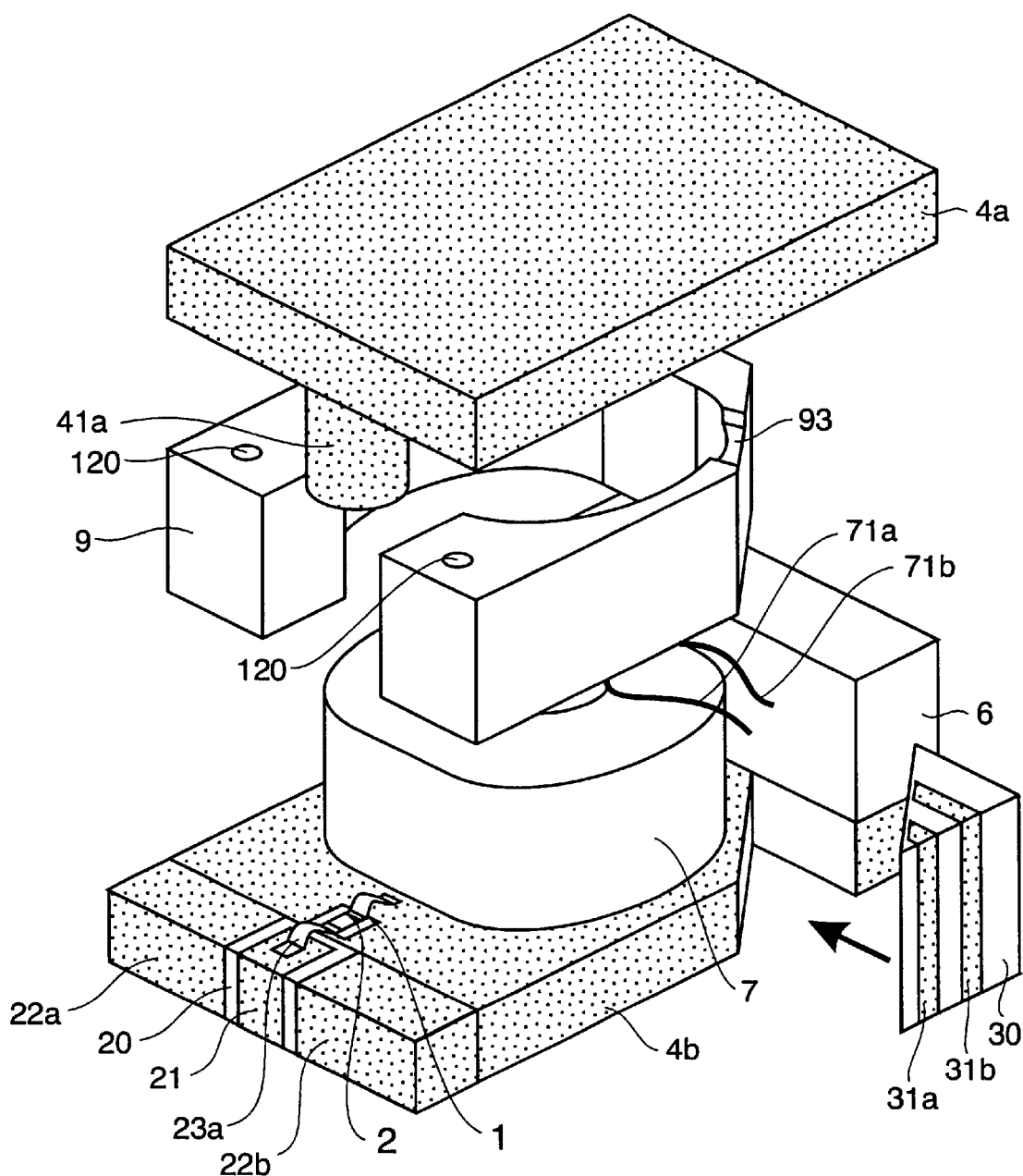
FIG. 13 is an exploded perspective view illustrative of yet another embodiment of the fourth aspect of the magnetostatic wave device.

It is noted that the number and shape of posts are not critical as in the case of each of the aforesaid embodiments of the present invention. In the magnetostatic wave device depicted in FIG. 13, the posts 91 and 92 shown in FIG. 11 are replaced by a post 9 provided in such a way as to surround a protrusion 41b and a coil 7. In FIG. 13, reference numerals 71a and 71b stand for leads of the coil 7, which are connected to conductor patterns 31a and 31b for the coil, respectively. The post 9 is further provided with grooves 93 for passing the leads therethrough. Furthermore, the post 9 is provided with through-holes 120.

Figure 12:
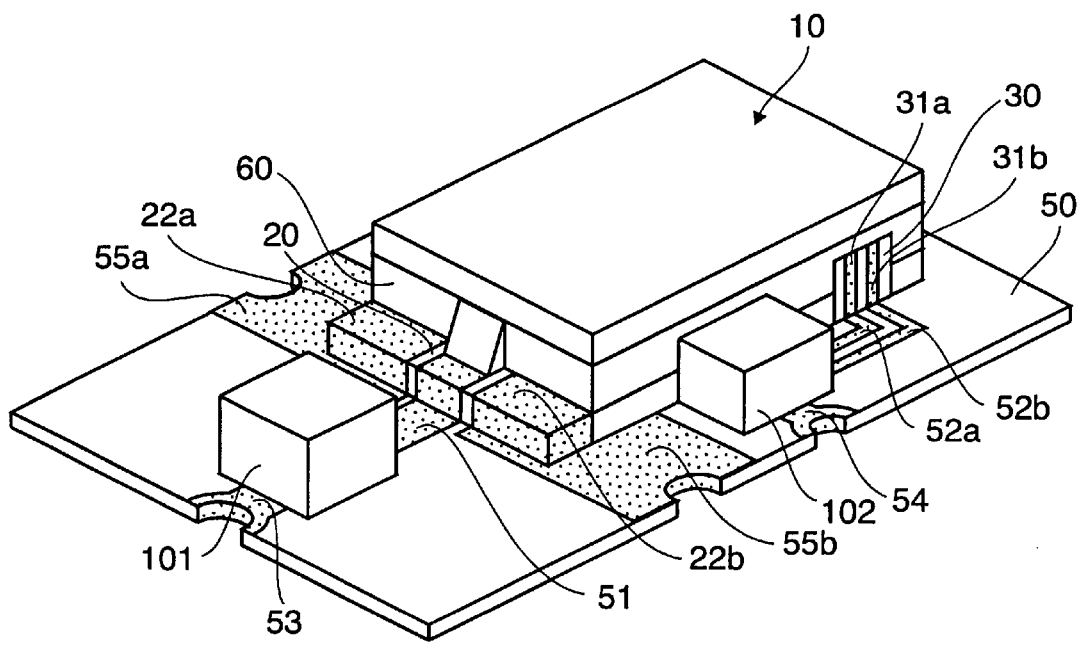
FIG. 12 is an exploded perspective view illustrative of another embodiment of the fourth aspect of the magnetostatic wave device.

In the fourth aspect of the present invention, an interconnecting substrate 50 mounted with a transmission line, a signal input/output conductor, a grounding conductor, etc. is provided ;as shown in FIG. 12. To this interconnecting substrate 50 there are fixed a magnetostatic wave device 10 having an insulating member 20 and a second insulating member 30, a high-frequency circuit 101 and a coil control circuit 102 to set up a magnetostatic wave assembly, which may in turn mounted on a main interconnecting substrate together with other electronic parts. For the fixation of the magnetostatic wave device 10, high-frequency circuit 101 and coil control circuit 102 to the interconnecting substrate 50, an electrically conductive adhesive agent such as cream solder may be utilized. In the illustrated embodiment, a conductor pattern 21 for signals and high-frequency circuit 101 are connected together by way of a transmission line 51 and the high-frequency circuit 101 is connected to the main interconnecting substrate by way of a signal input/output conductor 53. Conductor patterns 31a and 31b for the coil are connected to the coil control circuit 102 by way of transmission lines 52a and 52b, and the coil control circuit 102 is connected to the main interconnecting substrate by way of a coil control signal input/output conductor 54. Grounding conductor patterns 22a and 22b are connected to the main interconnecting substrate by way of grounding conductors 55a and 55b.

In FIG. 12, a resin 60 is filled as a molding material in a space present between yokes 4a and 4b. The filling of the resin into the space may be done, if required, for the purposes of making the magnetostatic wave device easy to handle, preventing oxidation of the members existing between the yokes, etc.

In the foregoing embodiments, two insulating members are provided, one being mounted with a conductor pattern for signals or a grounding conductor pattern and the other with a conductor pattern for the coil. It is understood, however, that only one insulating member may be provided to form the respective conductor patterns on its surface in an electrically insulated state. In the foregoing embodiments, both the conductor patterns for signals and coil are provided. It is understood, however, that either the conductor pattern for signals or the conductor patterns for the coil may be provided, if required. In the foregoing embodiments, the insulating members are fixed to one yoke alone. It is understood, however, that the insulating members may be provided astride both yokes.

As already explained, the fourth aspect of the present invention enables the magnetostatic wave device to be easily mounted on the surface of an interconnecting substrate. However, it is noted that even the magnetostatic wave device having the structure shown in FIGS. 1A and 1B may be mounted on the surface of the interconnecting substrate if, for instance, an insulating film formed on at least a part of the surface of the yoke 4a is provided thereon with a transmission line which terminates at the lower surface of the yoke 4b. However, it is very difficult to configure the magnetostatic wave device itself in such a manner as mentioned just above, and so the fabrication process becomes extremely complicated.

In what follows, an account is given of the preferable construction of each part in the magnetostatic wave device according to the present invention.

The requirements for the RF signal feed line 2 are that it exits in the air gap 81 wherein it is electromagnetically coupled to the ferrimagnetic film 1, and is unlikely to displace due to external perturbations; its contact with the ferrimagnetic film 1 is not always required. For instance, an adhesive layer, etc. may be present between the ferrimagnetic film 1 and the RF signal feed line 2.

In the illustrated embodiments, a GGG (gadolinium gallium garnet) substrate 3 is provided as a dielectric substrate, and the ferrimagnetic film 1 is then provided on the GGG substrate 3. However, how to dispose the ferrimagnetic film 1 in the air gap 81 is not limited to the illustrated embodiments. For instance, the ferrimagnetic film 1 may be formed on one major surface of the GGG substrate 3 by an LPE process or the like while the RF signal feed line 2 is formed on another major surface of the GGG substrate 3. Thereafter, the ferrimagnetic film 1 may be fixed directly or through a dielectric substrate of about 100 $\mu$m or less in thickness to the yoke 4b (or the surface of a conductor film when it is formed thereon) by means of an electrically conductive adhesive agent. In some cases, it is unnecessary to provide the GGG substrate.

While, in the illustrated embodiments, the protrusion around which a coil winding is wound to form the coil 7 is provided on the yoke, it is understood that a coil winding may be wound around a flat sheet form of yoke. In this case, the portion of the yoke around which the coil winding is wound may be of a circular, polygonal, elliptic or other shape in section. Alternatively, only a fixed magnetic field produced by the permanent magnet in the absence of any coil may be applied to the ferrimagnetic film.

The yoke with an integral protrusion may be formed of a high-permeability material such as iron or permalloy. In consideration of cost, ease of configuring and high saturation flux density, the yoke should preferably be formed of an iron material such as SS41.

Usually for the coil 7, an insulating material-clad copper wire may be used. For the permanent magnet 6, a sintered or bonded type of ferrite, and rare earth magnet may be used.

The RF signal feed line 2 formed on the ferrimagnetic film 1 should preferably be made up of a metal such as Ag, Au, Al, and Cu or an alloy containing at least one of such metals. The RF signal feed line 2 may be of either the single layer film type or the multilayer film type. Usually but not exclusively, the RF signal feed line may be formed by evaporation processes and photolithography techniques.

By setting up the magnetic circuit as shown in FIGS. 1A and 1B, the length La of the air gap 81 with the ferrimagnetic film 1 received therein can be reduced to 1 mm or less, so that an ever stronger magnetic field can be produced within the air gap 81 with a reduction in the magnetic resistance of a closed magnetic loop comprising air gap 82-yoke 4a-air gap 81-yoke 4b. With this arrangement, it is possible to decrease the volume of the coil and, hence, reduce the overall size of the magnetic circuit.

Usually but not exclusively, each part in the illustrated embodiments has the following dimensions. The GGG substrate 3 has a thickness of about 400 $\mu$m or less; the ferrimagnetic film 1 has a width of about 0.5 to 2 mm, a length of about 0.5 to 2 mm and a thickness of about 5 to 60 $\mu$m; and the RF signal feed line 2 has a thickness of about 2 to 15 $\mu$m. The yoke 4a, 4b has a length (as measured in the magnetic path direction) of about 3 to 20 mm, a width of about 2 to 20 mm and a thickness of about 0.5 to 3.0 mm; the magnetic pole portion has a sectional area of about 1 to 20 mm$^2$; the permanent magnet 6 has a sectional area of about 1 to 30 mm2 and a height of about 0.1 to 15 mm; and the coil 7 has an inside diameter of about 1 to 5 mm, an outside diameter of about 1 to 20 mm and a thickness of about 0.5 to 1.4 mm. The air gap 81 has an air gap length of about 0.12 to 0.5 mm, and the air gap 82 has an air gap length of about 0.01 to 0.5 mm. It is here noted that the coil 7 may be of a circular, elliptic, polygonal, square or other shape in section (vertical to the axis).

Referring back to the embodiment shown in FIG. 1A, there is one air gap for receiving the ferrimagnetic film 1 therein. However, it is acceptable to provide two or more air gaps, each with a ferrimagnetic film received therein. If, in this case, a plurality of air gaps having varying lengths are provided, it is then possible to make the resonance frequencies of the ferrimagnetic films differ from one another. Accordingly, this embodiment may be applied to a VCO (voltage-controlled oscillator) capable of performing transmission and reception simultaneously at two or more channel frequencies by making use of a changeover switch, for instance.

While magnetostatic wave resonators have been described as some actual examples of the magnetostatic wave device according to the present invention, it is understood that it will be obvious to those skilled in the art that the present invention is not limited to such magnetostatic wave resonators, and so may be carried out in various modified or altered embodiments without departing from the scope of what is claimed. Thus, the present invention may be applied to other magnetostatic wave device, for instance, a resonant magnetostatic wave filter.

EFFECTS OF THE INVENTION

According to the first aspect of the present invention, one pair of yokes and a post acting as a spacer therefor can be fixed together with no need of providing any adhesive layer between the major surfaces of the yokes and both end faces of the post, so that any variation in the spacing between the yokes can be reduced or minimized. For this reason, there is no or little variation in the length of the air gap with the ferrimagnetic film received therein. This enables magnetostatic wave devices to be mass produced with no or little performance variation.

In the second aspect of the present invention, one pair of yokes and a post are fixed together with the adhesive agent filled in the through-hole which is extended through the post in the direction of connecting both yokes together. Since there is thus no, or a slight if any, adhesive agent between the major surfaces of the yokes and the end faces of the post, the performance variation of the magnetostatic wave device due to thickness variations of an adhesive layer can be much more reduced than that of a conventional magnetostatic wave device. In addition, the weight of the post can be reduced by the provision of the through-hole. Thus, the provision of the through-hole is effective especially for the post formed of a metal. Furthermore, the provision of the through-hole enables the surface area of the post to be so increased that the electrical resistance of the post in a high-frequency range can be decreased.

In the third aspect of the present invention, a protrusion formed on one yoke and a surface portion of another yoke body opposite thereto define together a magnetic pole pair. For this reason, it is easy to configure the yokes and, hence, reduce fabrication costs. A', yoke with one protrusion is much higher in yields than a conventional yoke with two or more protrusions, even when their configuring accuracy is on the same level.

The magnetostatic wave device according to the fourth aspect of the present invention can be easily mounted on the surface of an interconnecting substrate of electric and electronic equipment.

What is claimed is:

1. A magnetostatic wave device comprising at least one ferrimagnetic film for exciting and propagating magnetostatic waves, an RF signal feed line for feeding RF signals to the ferrimagnetic film and a magnetic field generator for applying a magnetic field to the ferrimagnetic film, said magnetic field generator comprising, at least, a permanent magnet and one pair of yokes that are magnetically connected to the permanent magnet and are opposite to each other while an air gap with the ferrimagnetic film received therein is located between them, wherein:

said one pair of yokes are opposite to each other by way of at least a post formed of a non-magnetic material, and said post and said yokes are fixed together by engagement of at least one protrusion formed on either one of said yokes and said post within at least one recess formed in the other.

2. The magnetostatic wave device according to claim 1, wherein an inner peripheral surface of said recess is fixed onto an outer peripheral surface of said protrusion by means of an adhesive agent.

3. The magnetostatic wave device according to claim 1, wherein one post is provided in sucha a way as to surround sail ferrimagnetic film and said coil, with at least one opening existing in said post.

4. The magnetostatic wave device according to claim 1, wherein an inner peripheral surface of said recess is fixed onto an outer peripheral surface of said rod member by means of an adhesive agent.

5. The magnetostatic wave device according to claim 1, wherein said recess formed in said yokes or said post is a through-hole.

6. The magnetostatic wave device according to claim 1, wherein said one pair of yokes are electrically connected together by way of said post.

7. The magnetostatic wave device according to claim 1, wherein:
   a each of said one pair of yokes comprises a yoke body and at least one protrusion extending from said yoke toward another yoke, and each protrusion forms a magnetic pole pair with a surface portion of another yoke opposite thereto while an air gap is provided therebetween, and
   said ferrimagnetic film is disposed in an air gap across at least one of magnetic pole pairs.

8. The magnetostatic wave device according to claim 7, wherein a coil winding is wound around said protrusion at at least one of said magnetic pole pairs.

9. The magnetostatic wave device according to claim 1, wherein:
   said magnetic field generator comprises a coil for applying a variable magnetic field to said ferrimagnetic film,
   at least one insulating member is fixedly provided on at least one of said one pair of yokes,
   at least one of insulating members is provided on a surface thereof with a conductor pattern for said coil, which is electrically insulated from said one pair of yokes and electrically connected to a lead of said coil, and
   said conductor pattern for said coil, when mounted on a surface of an interconnecting substrate, is electrically connected to said interconnecting substrate.

10. The magnetostatic wave device according to claim 9, which further comprises an interconnecting substrate including a transmission line and a coil control circuit for supplying a variable current to said coil,
   at least said insulating members and said coil control circuit out of said magnetostatic wave device being fixed onto said interconnecting substrate, and
   said conductor pattern for said coil and said coil control circuit being electrically connected together by way of said transmission line.

11. The magnetostatic wave device according to claim 1, wherein:
   at least one insulating member is fixedly provided to at least one of said one pair of yokes,
   at least one of said insulating members is provided on a surface thereof with a conductor pattern for signals, which is electrically insulated from said one pair of yokes and electrically connected to said RF signal feed line, and
   said conductor pattern for signals, when mounted on a surface of an interconnecting substrate, is electrically connected to said interconnecting substrate.

12. The magnetostatic wave device according to claim 11, wherein:
   said magnetic field generator comprises a coil for applying a variable magnetic field to said ferrimagnetic film,
   at least one of said insulating members comprises on a surface thereof a conductor pattern for said coil which is electrically insulated from said conductor pattern for signals and electrically connected to a lead of said coil, and
   said conductor pattern for said coil, when mounted on a surface of an interconnecting substrate, is electrically connected to said interconnecting substrate.

13. The magnetostatic wave device according to claim 12, which further comprises an interconnecting substrate including a transmission line and a coil control circuit for supplying a variable current to said coil,
   at least said insulating members and said coil control circuit out of said magnetostatic wave device being fixed onto said interconnecting substrate, and
   said conductor pattern for said coil and said coil control circuit being electrically connected together by way of said transmission line.

14. The magnetostatic wave device according to claim 11, which further comprises and interconnecting substrate including a transmission line and a high-frequency circuit for supplying a high-frequency signal to said ferrimagnetic film,
   at least said insulating members and said high-frequency circuit out of said magnetostatic wave device being fixed onto said interconnecting substrate, and
   said conductor pattern for said coil and said high-frequency circuit being electrically connected together by way of said transmission line.

15. The magnetostatic wave device according to claim 11, wherein:
   a grounding conductor pattern, existing on a surface of at least one of said insulating members, is electrically insulated from another conductor pattern existing on a surface of another insulating member and electrically connected to at least one of said one pair of yokes, and
   said grounding conductor pattern, when mounted on a surface of an interconnecting substrate, is electrically connected to said interconnecting substrate.

16. The magnetostatic wave device according to claim 11, wherein:
   a shielding conductor pattern, existing on a surface of at least one of said insulating members, is electrically insulated from another conductor pattern existing on a surface of another insulating member, and
   said shielding conductor pattern, when mounted on a surface of an interconnecting substrate is electrically connected to said interconnecting substrate.

17. A magnetostatic wave device comprising at least one ferrimagnetic film for exciting and propagating magnetostatic waves, an RF signal feed line for feeding RF signals to the ferrimagnetic film and a magnetic field generator for applying a magnetic field to the ferrimagnetic film, said magnetic field generator comprising, at least, a permanent magnet and one pair of yokes that are magnetically connected to the permanent magnet and are opposite to each other while an air gap with the ferrimagnetic film received therein is located between them, wherein:
   said one pair of yokes are opposite to each other by way of at least a post formed of a non-magnetic material,
   and said post and said yokes are fixed together by engaging a rod member within at least one recess formed in each of said post and said yokes.

18. The magnetostatic wave device according to claim 17, wherein:
  said magnetic field generator comprises a coil for applying a variable magnetic field to said ferrimagnetic film,
  at least one insulating member is fixedly provided on at least one of said one pair of yokes,
  at least one of insulating members is provided on a surface thereof with a conductor pattern for said coil, which is electrically insulated from said one pair of yokes and electrically connected to a lead of said coil, and
  said conductor pattern for said coil, when mounted on a surface of an interconnecting substrate, is electrically connected to said interconnecting substrate.

19. The magnetostatic wave device according to claim 17, wherein one post is provided in such a way as to surround said ferrimagnetic film and said coil, with at least one opening existing in said post.

20. The magnetostatic wave device according to claim 17, wherein said recess formed in said yokes or said post is a through-hole.

21. The magnetostatic wave device according to claim 17, wherein:
  each of said one pair of yokes comprises a yoke body and at least one protrusion extending from said yoke toward another yoke, and each protrusion forms a magnetic pole pair with a surface portion of another yoke opposite thereto while an air gap is provided therebetween, and
  said ferrimagnetic film is disposed in an air gap across at least one of magnetic pole pairs.

22. The magnetostatic wave device according to claim 17, wherein said one pair of yokes are electrically connected together by way of said post.

23. The magnetostatic wave device according to claim 17, wherein:
  at least one insulating member is fixedly provided to at least one of said one pair of yokes,
  at least one of said insulating members is provided on a surface thereof with a conductor pattern for signals, which is electrically insulated from said one pair of yokes and electrically connected to said RF signal feed line, and
  said conductor pattern for signals, when mounted on a surface of an interconnecting substrate, is electrically connected to said interconnecting substrate.

24. A magnetostatic wave device comprising at least one ferrimagnetic film for exciting and propagating magnetostatic waves, an RF signal feed line for feeding RF signals to the ferrimagnetic film and a magnetic field generator for applying a magnetic field to the ferrimagnetic film, said magnetic field generator comprising, at least, a permanent magnet and one pair of yokes that are magnetically connected to the permanent magnet and are opposite to each other while an air gap with the ferrimagnetic film received therein is located between them, wherein:
  said one pair of yokes are opposite to each other by way of at least a post formed of a non-magnetic material, and said post is provided with at least one through-hole for connecting together both ends faces thereof contiguous to respective major surfaces of said yokes, and
  said post and said one pair of yokes are fixed together by means of an adhesive agent existing at least in said through-hole.

25. The magnetostatic wave device according to claim 24, wherein, at least, both end faces and an outer peripheral surface of said post as well as an inner peripheral surface of said through-hole are of electrical conductivity.

26. The magnetostatic wave device according to claim 24, wherein:
  said magnetic field generator comprises a coil for applying a variable magnetic field to said ferrimagnetic film,
  at least one insulating member is fixedly provided on at least one of said one pair of yokes,
  at least one of insulating members is provided on a surface thereof with a conductor pattern for said coil, which is electrically insulated from said one pair of yokes and electrically connected to a lead of said coil, and
  said conductor pattern for said coil, when mounted on a surface of an interconnecting substrate, is electrically connected to said interconnecting substrate.

27. The magnetostatic wave device according to claim 24, wherein:
  each of said one pair of yokes comprises a yoke body and at least one protrusion extending from said yoke toward another yoke, and each protrusion forms a magnetic pole pair with a surface portion of another yoke opposite thereto while an air gap is provided therebetween, and
  said ferrimagnetic film is disposed in an air gap across at least one of magnetic pole pairs.

28. The magnetostatic wave device according to claim 24, wherein one post is provided in such a way as to surround said ferrimagnetic film and said coil, with at least one opening existing in said post.

29. The magnetostatic wave device according to claim 24, wherein:
  at least one insulating member is fixedly provided to at least one of said one pair of yokes,
  at least one of said insulating members is provided on a surface thereof with a conductor pattern for signals, which is electrically insulated from said one pair of yokes and electrically connected to said RF signal feed line, and
  said conductor pattern for signals, when mounted on a surface of an interconnecting substrate, is electrically connected to said interconnecting substrate.

30. The magnetostatic wave device according to claim 24, wherein said one pair of yokes are electrically connected together by way of said post.

* * * * *

UNITED STATES PATENT AND TRADEMARK OFFICE
CERTIFICATE OF CORRECTION

PATENT NO. : 6,353,375 B2
DATED : March 5, 2002
INVENTOR(S) : Kurata

It is certified that error appears in the above-identified patent and that said Letters Patent is hereby corrected as shown below:

<u>Title page,</u>
Item [30], the Foreign Application Priority information should read:

-- [30]        Foreign Application Priority Data

Apr. 22, 1999 (JP) ........................... 11-115086
    Apr. 22, 1999 (JP) ........................... 11-115087
    Apr. 22, 1999 (JP) ........................... 11-115088
    Mar. 17, 2000 (JP) ....................... 2000-075852 --

Signed and Sealed this

Seventeenth Day of September, 2002

*Attest:*

*Attesting Officer*

JAMES E. ROGAN
*Director of the United States Patent and Trademark Office*